United States Patent [19]

Mayumi et al.

[11] 4,045,784

[45] Aug. 30, 1977

[54] PROGRAMMABLE READ ONLY MEMORY INTEGRATED CIRCUIT DEVICE

[75] Inventors: Hiroshi Mayumi; Yoshinobu Natsui; Norio Kusunose, all of Tokyo, Japan

[73] Assignee: Nippon Electric Co., Ltd., Tokyo, Japan

[21] Appl. No.: 648,283

[22] Filed: Jan. 12, 1976

[30] Foreign Application Priority Data

Jan. 10, 1975 Japan .................. 50-5464

[51] Int. Cl.² .................. G11C 17/00; G11C 11/40; G11C 7/00
[52] U.S. Cl. .................. 340/173 SP; 340/173 R; 357/34
[58] Field of Search .................. 340/173 R, 173 SP; 357/34, 40

[56] References Cited

U.S. PATENT DOCUMENTS

| | | | |
|---|---|---|---|
| 3,810,123 | 5/1974 | Baitinger et al. | 357/48 |
| 3,817,794 | 6/1974 | Beadle et al. | 357/34 |
| 3,911,470 | 10/1975 | Ruegg | 357/40 |

OTHER PUBLICATIONS

Frederiksen et al., Transistor Advances, Motorola Monitor, vol. 8, No. 1, 1970, p. 24.

Primary Examiner—Stuart N. Hecker
Attorney, Agent, or Firm—Hopgood, Calimafde, Kalil, Blaustein & Lieberman

[57] ABSTRACT

A read only memory integrated circuit includes a first group of transistors serving as the memory elements, and a second group of transistors in a memory peripheral circuit and integrated in the same substrate as the memory transistors. The base width of the first group of memory transistors is greater than that of the second group of transistors in the peripheral circuit.

3 Claims, 4 Drawing Figures

PROGRAMMABLE READ ONLY MEMORY INTEGRATED CIRCUIT DEVICE

The present invention relates generally to programmable read only memory integrated circuit devices, and more particularly, to an integrated circuit (IC) device including a programmable memory array having floating-base bipolar transistors as memory elements.

Various types of programmable read only memory (hereinafter referred to as P-ROM) are known. As distinguished from a fuse-type P-ROM, which employs a nichrome fuse wire for each memory element, the so-called junction type P-Rom uses a bipolar transistor for each memory element in which data is stored in binary form as indicated by whether or not there is a short circuit at the transistor base-emitter junction. The junction-type memory is being given serious consideration in that it does not require the formation of a nichrome fuse wire and can be fabricated by conventional bipolar process. A junction-type P-ROM employing floating-base transistors as memory elements is particularly desirable, because the base-collector diodes can be used as decoupling diodes in a memory element array, and because no isolation is required between the transistors in each row of the matrix array as the collectors of these transistors in each row can be connected in common.

Programming in the junction-type P-ROM, is achieved by short circuiting the emitter-base junction of the selected transistor, by applying a voltage between the emitter and the collector of a sufficient level to cause breakdown of the base-emitter junction to allow a large current to pass through the junction for a predetermined period of time and thereby to locally raise the temperature of the junction with a Joule's heat. Since there exists a collector-base junction in close proximity of, or at a distance of the base width from, the emitter-base junction to be short circuited, at the time of programming greater attention must be paid to the magnitude and duration of the programming current, so that the collector-base junction will not be deteriorated. If the collector-base junction of any one of the memory transistors is deteriorated during programming, the breakdown voltage of that collector-base junction becomes quite low and programming for the remaining memory transistors becomes impossible.

When a memory array of a P-ROM is formed in an integrated circuit structure, memory peripheral circuits, such as an address circuit for selecting the memory elements and a sensing circuit for reading out the stored information in the memory elements, are integrated together with the memory array in one chip of the semiconductor substrate. In the known junction-type P-ROM integrated circuits, the base width of the transistors serving as the memory elements have been chosen equal to that of the transistors in the memory peripheral circuit integrated with the memory transistors on the same semiconductor chip. In general, the depth of the emitter-base junction and a base width of transistor in an integrated circuit largely affect such characteristics of the transistor as the current amplification factor and frequency response, so that the base width of the transistors in the memory peripheral circuit is compelled to be shallow by reason of the characteristics required for these transistors. As a result, the base width of the transistors serving as the memory elements is likewise shallow. Consequently, the collector-base junction thus existing in the very close proximity of an emitter-base junction is very frequently deteriorated by the programming current.

It is an object of the present invention to provide a junction-type P-ROM integrated circuit which permits freedom and latitude in programming conditions without likelihood of collector-base junction deterioration.

In the read only memory integrated circuit of the present invention, the base width of the floating-base transistors serving as the memory elements is larger than that of the transistors in the memory peripheral circuit which are integrated with the floating-base transistors on the same surface of the semiconductor substrate.

The P-ROM integrated circuit device of the invention may be manufactured by introducing an impurity such as by diffusion or ion implantation into the substrate more deeply as measured from the surface of the substrate when forming the base region of the memory transistors, than while forming the base region of the transistors for the memory peripheral circuits, and subsequently forming emitter regions of all the transistors to have the same depth.

Alternatively, the P-ROM integrated circuit of the invention may be manufactured through the formation of base regions of the transistors in the memory array as well as in the memory peripheral circuits to the game depth, and the formation of the emitter region of the memory transistors to a greater depth than that of the transistors in the memory peripheral circuits.

According to the present invention, since the memory transistors have a larger base width, the collector-base width, the collector-base junction of any memory transistor would not deteriorate during programming, and hence the programming conditions can be freely selected. In addition, the base width of the transistors in the memory peripheral circuit section is smaller than that of the memory transistors and can be determined in accordance with the performances required for these transistors. Thus, an improved P-ROM integrated circuit device can be obtained without deteriorating the performance of the memory peripheral circuits.

These and other features and objects of the invention will become more apparent by reference to the following description taken in conjunction with the accompanying drawing, in which.

Figure 1:
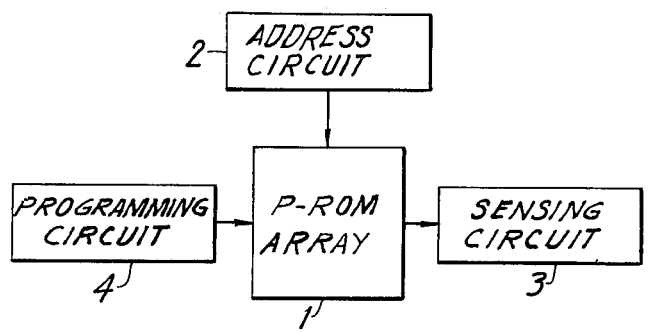
FIG. 1 is a block diagram of a P-ROM integrated circuit.

Referring now to FIG. 1, there is shown in block diagram form, a junction-type P-ROM array 1, which is integrated in one semiconductor chip. In the same chip are integrated peripheral circuits for selecting and driving the memory array 1. The peripheral circuits generally include an address circuit 2, which in turn comprises an address buffer circuit and an address decoder circuit, a sensing amplifier circuit 3 for reading out stored information of the memory array 1, and a programming circuit 4 for programming the P-ROM array 1. These peripheral circuits may typically employ bipolar transistors.

Figure 2:
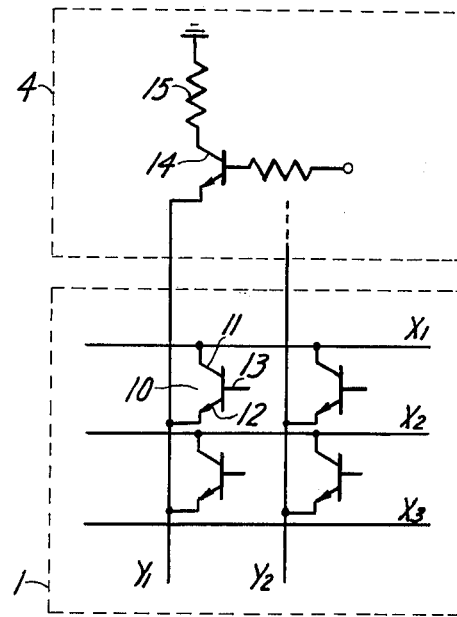
FIG. 2 is a circuit diagram showing parts of a memory array and a programming circuit.

FIG. 2 is a circuit diagram showing parts of the memory array 1 and the programming circuit 4. The memory array 1 comprises a plurality of electrical conductors consisting of row conductors X1, X2, X3 — and column conductors Y1, Y2, —, and memory transistors 10 connected at the respective intersections of the row and column conductors. Each memory transistor 10 has a collector 11 connected to a corresponding row conductor and an emitter 12 connected to a corresponding column conductor, but its base 13 is normally not connected to any circuit point. Thus, the emitter-base NP junction and base-collector PN junction of each memory transistor 10 are connected in series between the row and column conductors. Programming is carried out by short circuiting one of these PN junctions in the memory transistor 10 at a selected intersection of the row and column conductors.

The programming circuit 4 includes transistors 14 each of which as an emitter connected to the corresponding column conductor. The collector of each of the transistors 14 is connected to a power source through an impedance 15. During programming, the base of the selected transistor 14 is supplied with a write-command signal. The transistors 14 are formed on the same semiconductor chip on which memory transistors 10 are formed, as described above. According to the present invention, the base width of each of the memory transistors 10 is larger than that of all the transistors in the peripheral circuits 2 to 4 (FIG. 1) including the transistors 14 in the programming circuit 4 (FIG. 2). One example of an integrated circuit construction according to the invention is shown in FIG. 3.

As therein shown, an N-type layer 15 of 6μ in thickness is formed on a P-type substrate 9 such as epitaxial technique. A P-type impurity is selectively introduced into layer 15, such as by diffusion or ion implantation to provide a P-type isolation region 16 extending to the surface of the substrate for separating and isolating N-type collector regions 17 and 18 from each other. In one N-type region 17 of the epitaxial layer 15 is formed the transistor 14 in the programming circuit 4. In the other N-type region 18 is formed the memory transistors 10 whose collectors 11 are connected in common to form the row conductor X1. In the figure, only one transistor 10 is illustrated among the memory transistors whose collectors are connected in common, for the sake of simplicity. These transistors 10 and 14 are formed by selective diffusion of ion implantation of impurities into the isolated collector regions 17 and 18 of the epitaxial layer 15.

In the illustrated embodiment, the integrated circuit device is formed in such manner that the depth of the collector-base junction $C_{j1}$ of the transistor 14 in the programming circuit 4 as measured from the surface of the epitaxial layer 15 is equal to 2μ, and the depth of the emitter-base junction $E_{j1}$ of the same transistor 14 is equal to 1.5μ. On the other hand, the depth of the collector-base junction $C_{j2}$ of the transistor 10 in the memory array is equal to 3μ, and the depth of the emitter-base junction $E_{j2}$ of the same transistor 10 is equal to 1.5μ. Therefore, the base width of the memory transistor 10 is equal to 1.5μ, while that of the transistor 14 in the programming circuit is equal to 0.5μ. Since the base width of the memory transistors is broader than that of the transistors in the peripheral circuits, the collector-base junction of the memory transistor is less adversely affected by the energy applied at the time of programming than that of the heretofore known memory transistors, as described previously.

Figure 3:
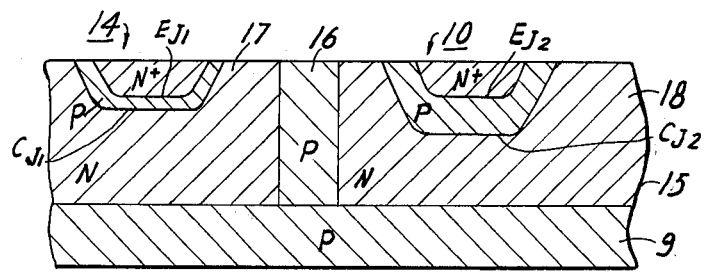
FIG. 3 is a partial, cross-sectional view of an integrated circuit showing an embodiment of the present invention.
Figure 4:
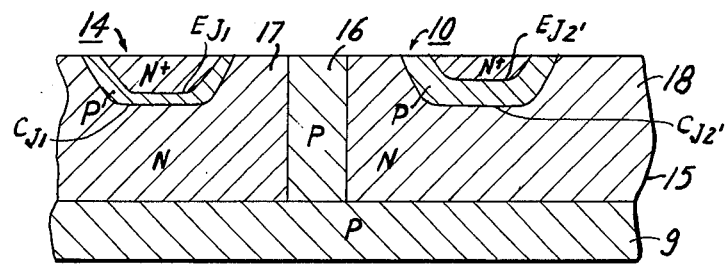
FIG. 4 is a partial, cross-sectional view of an integrated circuit showing another embodiment of the present invention.

FIG. 4 is a partial, cross-sectional view of an integrated circuit showing a second embodiment of the present invention, in which component parts equivalent to those shown in FIG. 3 are indicated by the same reference numerals. The only difference from the embodiment shown in FIG. 3 is that the integrated circuit device is constructed in such manner that in the memory transistor 10, the depth of the collector-base junction $C_{j2}'$ is 2μ equal to that of the transistor 14 in the programming circuit, and the depth of the emitter-base junction $E_{j2}'$ is equal to 1μ. Therefore, the base width of the memory transistor 10 is equal to 1μ which is larger than the base width of 0.5μ of the transistor 14 in the programming circuit. In this embodiment, since the emitter-base junction $E_{j2}'$ is as shallow as 1μ, the energy required for programming can be made smaller than that required in the embodiment of FIG. 3, and thereby the collector-base junction $C_{j2}'$ can be better protected.

In either embodiment, it is only necessary to provide an additional diffusion or ion-implantation process to form the base or emitter regions in comparison with the heretofore known process, and thereby it becomes possible to obtain a junction-type P-ROM in which there is considerable freedom in the programming conditions.

Since many changes could be made in the above construction and many variations of the embodiments could be made without departing the scope of the invention, it is intended that all matter contained in the above description or shown in the accompanying drawings shall be interpreted as illustrative and not in a limiting sense.

What is claimed is:

1. A read only memory integrated circuit device comprising a semiconductor substrate, a memory array including a column conductor and a first group of transistors serving as memory elements integrated on a surface of said semiconductor substrate, each of said transistors having emitter, base, and collector regions, said emitter region being connected to said column conductor, said base region being located below said emitter region and being at a floating potential, said collector region being located below said base region and forming the row of said memory array, and programming means including a second group of transistors integrated on said surface of said semiconductor substrate for applying a voltage between the emitter and collector regions of at least one selected transistor of said first group of transistors to reverse bias the emitter-base junction of said selected transistor, thereby to cause a short-circuit of said emitter-base junction, the base width of said first group of transistors exceeding that of said second group of transistors.

2. The read only memory integrated circuit device as claimed in claim 1, in which the depth of the collector-base junction of said first group of transistors as measured from said surface of said semiconductor substrate is deeper than that of said second group of transistors.

3. The read only memory integrated circuit device as claimed in claim 1, in which the depth of the emitter-base junction of said first group of transistors as measured from said surface of said semiconductor substrate is shallower than that of said second group of transistors.

* * * * *